US007949986B2

(12) United States Patent
Gehman

(10) Patent No.: US 7,949,986 B2
(45) Date of Patent: May 24, 2011

(54) METHOD FOR ESTIMATION OF TRACE INFORMATION BANDWIDTH REQUIREMENTS

(75) Inventor: Judy Gehman, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 430 days.

(21) Appl. No.: 12/144,248

(22) Filed: Jun. 23, 2008

(65) Prior Publication Data

US 2009/0319963 A1 Dec. 24, 2009

(51) Int. Cl.
*G06F 17/50* (2006.01)
*G06F 15/04* (2006.01)

(52) U.S. Cl. ........ 716/138; 716/139; 716/100; 716/101; 716/102

(58) Field of Classification Search .......... 716/100–102, 716/138–139
See application file for complete search history.

(56) References Cited

U.S. PATENT DOCUMENTS

| 6,052,524 | A  | * | 4/2000  | Pauna ............................. 703/22 |
|-----------|----|---|---------|-------------------------------------------|
| 6,735,747 | B2 | * | 5/2004  | Watkins ............................ 716/4 |
| 6,760,898 | B1 | * | 7/2004  | Sanchez et al. ................. 716/16   |
| 2003/0097615 | A1 | * | 5/2003  | Corti et al. ...................... 714/37 |
| 2005/0149892 | A1 | * | 7/2005  | Yee .................................. 716/4 |
| 2006/0112310 | A1 | * | 5/2006  | McHale et al. ................. 714/15    |
| 2006/0259827 | A1 | * | 11/2006 | Sohm et al. ..................... 714/38  |
| 2007/0006172 | A1 | * | 1/2007  | Swoboda et al. ............. 717/131      |
| 2007/0006174 | A1 | * | 1/2007  | Sohm et al. ................... 717/131   |
| 2007/0265822 | A1 | * | 11/2007 | Mathewson et al. ........... 703/22       |

* cited by examiner

*Primary Examiner* — Stacy A Whitmore
(74) *Attorney, Agent, or Firm* — Clark Hill PLC

(57) ABSTRACT

A method of evaluating the feasibility of a CoreSight trace architecture in a SoC before the hardware and/or firmware is available allowing for better die size estimates (IO count and gate count) and package requirement for the design in the early stages of planning.

32 Claims, 11 Drawing Sheets

METHOD FOR ESTIMATION OF TRACE INFORMATION BANDWIDTH REQUIREMENTS

BACKGROUND

When debugging System on a Chip (SoC) it is often desirable to use non-invasive debugging techniques which allow the capture of information in real-time without altering the device undergoing testing. This information is often referred to as trace information. Trace information can include instruction and data information from a processor, on-chip bus transaction information, and other signals in the SoC. The trace information can be captured either off-chip by a trace port analyzer (TPA) through a trace port or can be captured on-chip in an embedded trace buffer (ETB). Debugger software analyzes this trace information and puts it in a form that allows the user to determine what is going on inside the SoC allowing for debugging of the SoC (hardware and firmware) and for optimization of firmware.

When designing a SoC, considerations must be made as to the hardware required for capturing trace information. These considerations include determining the width of the trace port for off-chip capture, determining the size of memory for on-chip trace capture, and determining the appropriate speeds of clocks in the debug and trace system.

CoreSight Architecture from ARM, Ltd. provides hardware for generating trace source information (Embedded Trace Macrocell (ETM), AMBA (Advanced Microprocessor Bus Architecture) AHB (AMBA High-performance Bus) Trace Macrocell (HTM)), for merging and transferring this information throughout the SoC (AMBA Trace Bus (ATB), funnel block, replicator block), for capturing the trace information on-chip (Embedded Trace Buffer (ETB)), and for driving the trace information off-chip on the trace port for off-chip capture (Trace Port Interface Unit (TPIU)). When designing a SoC using the CoreSight Architecture, ARM Ltd., recommends simulating the firmware with the architecture to ensure the design will meet trace bandwidth needs. For example, to determine whether the trace port width, size of ETB SRAM, and clock speeds are adequate. ARM does not provide a quick estimation tool.

In order to select the proper SoC technology, the clock speed, gate-count and power information must be determined. The on-chip buffer size must be determined in order to estimate the die size. The IO pin count must be known to determine the package. This information is needed early for estimating the price of the design, for designing the system board, for selecting the correct architecture necessary to implement; to meet time-to-market goals, and to allow implementation of a successful trace system.

An early method to evaluate the SoC design and to make trade-offs in an architecture is to use ESL methods such as System C or SystemVerilog simulations. ESL methods require models for all blocks in the design as well as representative firmware to run. However, sometimes the blocks and firmware are not available to perform ESL simulations early in the design flow.

Another method for evaluating the SoC design is to run simulations with the firmware with either high-level modes, RTL or gate-level netlist in order to finalize clock speeds, RAM sizes, and IO pins (trace port) requirements. Running the simulations requires that firmware has been developed and is available for the SoC. It also requires some representation (high-level models, RTL or gate-level netlist) of the design. Sometimes one or both of these items are not available at the time of initial design work. Waiting until the firmware is completed and the RTL or gate-level netlist are available, however, is not practical.

Another method for evaluating the SoC design is to estimate/guess (hopefully based on previous design experience). Estimations will need to be made as to the clock speeds, SRAM size, and trace port width. If the estimate is not accurate, however, many factors in the design process will be affected. If the estimate is grossly inaccurate, serious delays in the chip development could cause a delay and market window for the chip to be missed, or could result in a debug trace system which does not work. If a prototype debug is used, it could also result in troubles using the debug trace system to debug the design and/or firmware leading to time to market issues.

Finally the SoC design can by evaluated using hand calculations. Performing hand calculations, however, can be tedious and error prone.

The present invention provides a software program and method which overcomes the problems presented in the prior art and which provides additional advantages over the prior art, such advantages will become clear upon a reading of the attached specification in combination with a study of the drawings.

OBJECTS AND SUMMARY OF THE INVENTION

The object of the invention is to provide a rough estimate of the trace bandwidth requirements before the firmware and/or hardware models/RTL/netlist are available so that architectural decisions relating to the SoC can be made.

Briefly, the present invention discloses a method to vary design parameters to determine if a particular trace architecture is feasible to implement. A program is provided which allows the user to input particular design parameters regarding a proposed architecture. The program provides the user with information, such as the level of data in the FIFO; incidents for FIFO overflow; data suppression events etc. which can then be analyzed by the user to determine the feasibility of the proposed architecture.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DESCRIPTION

Figure 1:
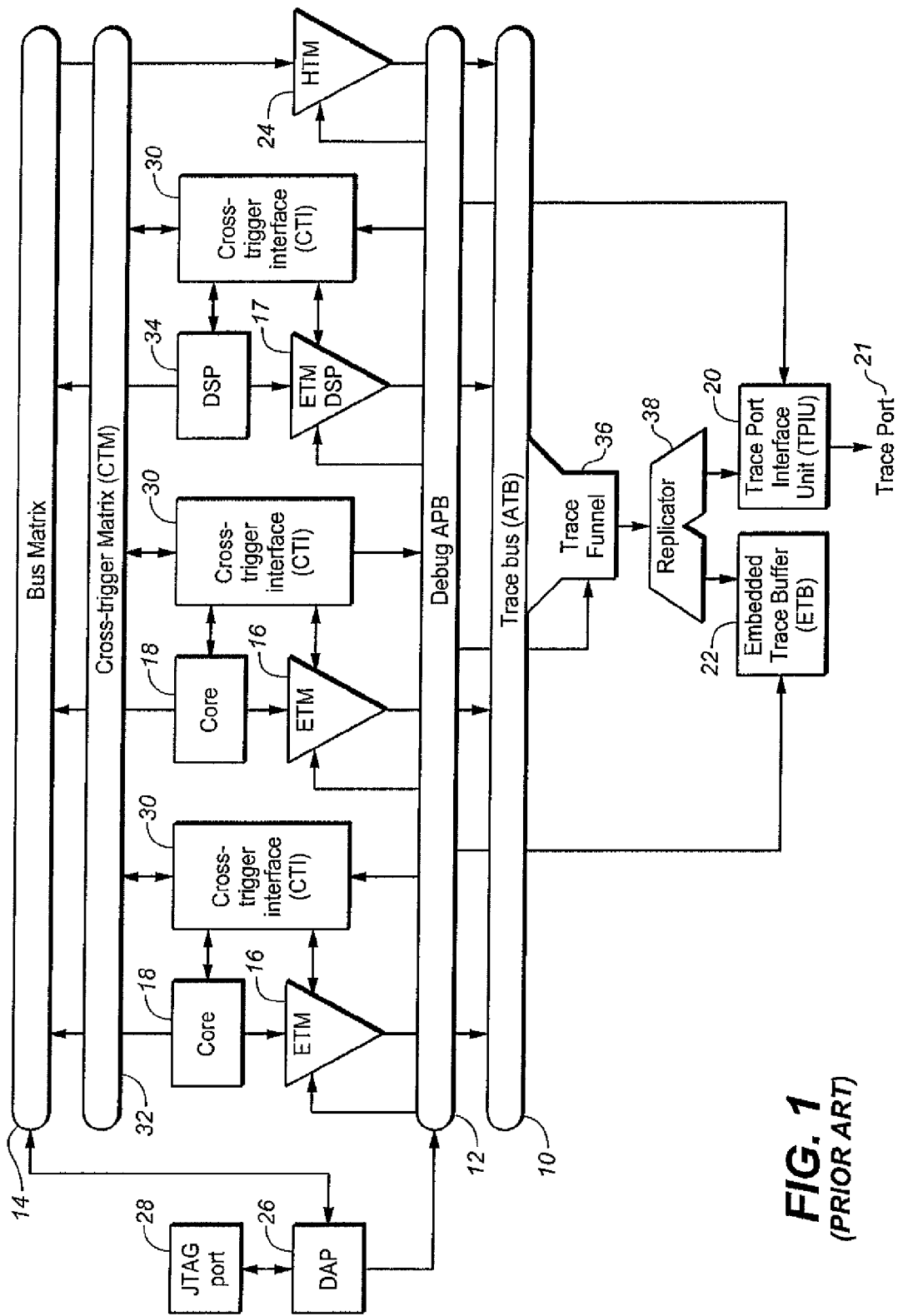
FIG. 1 illustrates prior art CoreSight components in a debugging environment.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

The invention utilizes information provided by ARM Ltd., in their CoreSight documentation regarding bandwidth requirements for trace sources, ETM FIFO size, TPIU FIFO size, and the CoreSight block features. This information is combined with information provided by the customer regarding system architecture, clock speeds, trace port width, cycles per instruction, cycles per data, and the type of information to be collected to determine if the proposed architecture will work. By automating this analysis, the user has the ability to perform many quick trade-offs, and easily determine how full the FIFOs become and how much information can be traced before data suppression or FIFO overflows occur for the proposed architecture. The invention, therefore, allows the user to get a quick rough idea as to whether the proposed architecture is feasible before eventually fully verifying it with a working model (C system, SystemVerilog, RTL, or gate netlist) with their firmware.

ARM Ltd., developed a solution for real-time debug and trace called the CoreSight™ Architecture. *CoreSight Architecture Specification*, ARM IHI 0029B is published by ARM, Ltd. and is available at www.arm.com. CoreSight provides the ability for invasive debugging that affects the system under test and non-invasive debug that does not alter the program under test. FIG. 1 shows an example CoreSight architecture which was taken from the ARM Ltd., *CoreSight Components Technical Reference Manual*, ARM DDI 0314D. This document is also available at www.arm.com.

FIG. 1 illustrates various buses. ATB 10 is used to transfer trace data, the debug APB 12 is used to configure the CoreSight system, and the system bus is represented by the Bus Matrix 14, Advanced High-Performance Bus (AHB), in this case.

Several trace sources are also illustrated in FIG. 1. The ETM block 16 is considered a trace source which monitors the activity of the processor 18 (designated "Core" in FIG. 1). The instruction and/or data activity from the ETM is encoded and communicated off-chip (through the TPIU 20 and trace port 21) to be captured by a trace port analyzer (TPA) or on-chip to be captured by the ETB 22. Debugger software correlates the trace activity against the memory image of the program to generate program execution trace.

The HTM block 24 is also a trace source that monitors the activity on the AHB bus, encodes that activity and like the ETM 16 communicates it off-chip through the TPIU 20 or on-chip to the ETB 22.

The ITM block (not shown in FIG. 1) is a trace source that can be used by the software to insert information into the trace stream on the ATB bus 10. The main purpose of the ITM is to support print style debugging, trace OS, and application events, and emit diagnostic system information. The ITM block connects to the debug APB bus 12 for processor access through the DAP 26 and the ATB 10 bus to output trace stream.

Other trace sources can exist in the debug system (not shown in FIG. 1) to collect other SoC information such as state machine states, control signal values, and other signal values that would be useful to observe during debug.

The ETM-DSP block 17 monitors the activity of the DSP 34. The instruction and/or data activity from the ETM-DSP 17 is encoded and communicated off-chip (through the TPIU 20 and trace port 21) to be captured by a trace port analyzer or on-chip to be captured by the ETB 22.

The ETB 22 and TPIU 20 blocks in FIG. 1 are considered trace sinks and are used to capture the trace stream generated by the trace sources.

The DAP 26 in FIG. 1 is used by the external debugger to access the debug and trace system through use of a debug IEEE JTAG 28 port on the chip interface. This can be used to extract captured on-chip trace from the ETB 22.

The CTI 30 and CTM 32 blocks of FIG. 1 allow event cross triggering between the processors (Core 18 & DSP 34) and CoreSight components. Triggers can be used to indicate when trace data should be captured.

The CoreSight Architecture provides non-invasive debug which allows the user to observe the processor instruction and/or data trace execution stream using the ETM block 16 and AHB bus activity through the HTM block 24. Arm Ltd., is also developing a PTM (Program Trace Module) block similar to the ETM, but is limited to instruction-only trace.

Customer Input and Fixed Conditions

Before developing the flow charts for the program, the required customer input, fixed conditions, and the components of the CoreSight system need to be analyzed. This section breaks down each component by following the data flow from the processor to the trace sink.

ETM

The ETM 16 is a trace source and contains a FIFO of a fixed size. The size of the FIFO depends on the processor that the ETM 16 supports. The preferred embodiment of the present invention supports the ETM9, ETM11, and ETMR4. It is to be understood that the invention can be modified to support additional processors.

The ETM9 has a FIFO size of 60 bytes and supports the ARM9 processor family. The ETM11 has a FIFO size of 72 bytes and supports the ARM11 processor family. The ETMR4 has a FIFO size of 72 bytes and supports the Cortex R4 processor. The ETM FIFO has data placed into it at the processor clock rate, CLK. The data is taken out of the FIFO at the AMBA Trace bus clock rate, ATCLK.

The most complicated aspect is to determine how much data to put into the ETM FIFO per CLK cycle and how often to put data into the ETM FIFO. Table 1 is taken from the ARM Ltd., document entitled *CoreSight™ Technology System Design Guide*, ARM DGI 0012A.

TABLE 1

Effect of different tracing levels on ETM bandwidth requirements

| Data Trace Level | Cycle-accurate mode | Average bits per instruction | Average bits per data transfer |
|---|---|---|---|
| Instruction plus data | No | 4 | 40 |
| Instruction only | No | 1.2 | N/A |
| Instruction plus data | Yes | 8 | 40 |
| Instruction only | Yes | 6 | N/A |

Table 1 only provides estimation to cover instruction and data address and data value traces. No estimates for data address only or data value only are provided. The invention, therefore, cannot provide throughput estimates for only data address or data value tracing. Using both data address and value tracing will, however, give a worst case estimate on data tracing and, therefore, should be successful in providing rough architecture estimates.

ARM Ltd., does not currently provide information for other types of tracing such as CPRT (CoProcessor register transfers).

In utilizing the program of the present invention, the user will need to specify the desired trace information. This can be used in conjunction with Table 1 to determine how much data to put into the ETM FIFO. The user will also need to specify how often (or when) to put trace information into the ETM FIFO. This can be determined by understanding rated cycles per instruction (CPI) for the processor that will be driving the ETM FIFO. This value can be used to determine the CLK cycle at which the instruction trace information should be placed in the ETM FIFO. A CPI of "1", for example, means that on every CLK cycle instruction trace information should be placed in the ETM FIFO. While a CPI of "2", for example, means that instruction trace information should be placed in the ETM FIFO on every other CLK cycle. The program of the present invention allows for real, not just integer, CPI values, but preferably is configured to not accept a CPI value of less than 1.

Information available from ARM's website indicates that in general, the average CPI for the ARM9 family is approximately 1.5 cycles per instruction. The ARM11 CPI is approximately 1, assuming the caches are enabled. The Cortex-R4 CPI is approximately 1, assuming the caches are enabled. In general, when a processor cache is not enabled, its CPI is dependent on the system memory or L2/L3 cache performance and will be greater than 1.

If the user will be tracing data address and/or data value information, the user must specify how often it expects the application (firmware) to perform data transfers. The program of the invention must receive information regarding the cycles per data (CPD). Using this number relative to the CPI value gives an estimate for the ratio of data loads and stores to instruction fetches. This number is application specific. The program inserts into the ETM FIFO the bits for one data transaction (address & data value), it does not replicate a burst (cache line fill) occurring. If the user desires to estimate a burst, the user must decrease the CPD number to obtain more data transactions.

The ETMs 16 have a configuration option to enable data suppression. Data suppression causes data tracing to be disabled when the FIFO is close to overflowing. Instruction tracing is unaffected. Data suppression is used to help prevent overflowing the FIFO. The FIFO has a configuration register which is used to specify the level of data in the FIFO at which data suppression will occur. The user provides an indication to the program of the present invention if data suppression has been enabled and at what level in the FIFO the data suppression will occur.

The number of bits taken out of the ETM FIFO at the ATCLK clock rate is determined by the debug and trace architecture implemented. If the trace information is going to a funnel 36, ETB 22, or TPIU 20, the trace information is taken out of the ETM FIFO 32-bits at a time. If the trace information is going to the TPIU-Lite or directly to the trace port, the amount of data taken out of the ETM FIFO is determined by the trace port width.

In summary, with respect to the ETM the input needed from the user includes:
ETM (ETM9, ETM11, ETMR4)
Processor clock speed (CLK)
AMBA Trace Bus clock speed (ATCLK)
Type of trace information (instruction, data, or both instruction and data)
Cycle Accurate trace information or not
Cycles per instruction
Cycles per data
Data suppression enabled or disabled
Data Suppression level
Trace port width (2, 4, 8, 16, 32)
HTM The HTM 24 is a trace source. The HTM 24 is configurable to support a 64-bit wide AHB bus (HTM64) and 32-bit wide AHB bus (HTM32 and HTM32L). The *AMBA AHB Trace Macrocell* (*HTM*) *Technical Reference Manual* ARM DDI 0328C2a lists the HTM64 FIFO as 64 Bytes, HTM32 FIFO as 32 Bytes, and the HTM32L as 64 Bytes.

The HTM 24 can be programmed to capture address, data, and/or auxiliary (control) information from the AHB bus. The user must provide an indication to the program of the present invention as to what type of information is being captured.

ARM Ltd., does not provide a table similar to that of Table 1 relating to the bandwidth requirements for HTM. Thus, it is difficult to obtain values which can be utilized for putting information into the HTM FIFO. The HTM Technical Reference Manual indicates that the FIFO can receive up to 18 bytes and output up to 4 bytes per cycle (Section 1.5.2). There are many different packets that can be placed in the FIFO. These include the address, data, and auxiliary packet containing the AHB bus information as well as packets required for operation with the CoreSight system and debugger. These include the A-Sync, Trigger, Sequential address, Ignore, Trace Off, Data suppressed, FIFO overflow, AHB reset, and CycleCount packets.

Considering the packets containing AHB bus information, the address packet can be 6 bytes (48 bits), the data packet up to 9 bytes (72 bits), and the auxiliary packet 2 bytes (16 bits). Packets are reduced when possible. For example, only valid data bytes are captured and in the case of bursts, the address packet is only put out once, and is followed by all data packets. With all the different suppression techniques used by the HTM 24, it is not practical to use the values above in an estimation tool.

One way to get trace bandwidth estimates per trace type is to build a system with the HTM 24 and run example software to analyze the average number of bits for each information trace type. Several different types of software applications should be run to take an average. In the current invention, the HTM 24 is not supported but in the event this trace bandwidth information becomes available, the current invention will support HTM 24.

The HTM 24 has a data suppression feature. If the FIFO is almost full (a programmable level) only address packets are stored. Data and auxiliary packets are suppressed. Data suppression is deactivated when the space left in the FIFO is larger than the programmed level. If FIFO full, trace is lost until FIFO has room again.

In summary, with respect to HTM, the input required from the user includes:

HTM (HTM64, HTM32, HTM32L)
AHB bus clock speed (HCLK)
AMBA Trace Bus clock speed (ATCLK)
Information traced; address, data, and/or auxiliary
Cycle Accurate trace information or not
AHB bus activity (Number of cycles per transfer)
Data suppression enabled or disabled
Data suppression level Funnel The funnel 36 is used to combine more than one trace source into a single trace stream (i.e. one ATB bus 10) that can be captured either off-chip (TPIU 20, trace port, TPA) or on-chip (ETB 22). The funnel 36 can be configured to specify if a trace source input is enabled/disabled and the number of transactions that are outputted on the funnel output port from the same trace source input port before switching to another trace source input port. This controls the through-put of the trace source input through the output. The funnel 36 can also be configured to assign priority levels to each trace source input.

The user must provide information to the program to specify the estimated activity level as a percentage (0-100) that the ETM 16 under consideration will have through the funnel.

In summary, with respect to the funnel 36, the input needed from the user is the percentage this ETM 16 is enabled by the funnel.

ETB

The ETB 22 is a trace sink. The ETB 22 contains a 32-bit SRAM for the trace information. The data is put into the SRAM at the AMBA Trace bus speed (ATCLK). This is a circular buffer that continues to capture data until a trigger occurs. This circular buffer starts ignoring trace data some configurable time after the trigger. The size of the SRAM is configurable by the user and this determines how much trace information can be captured.

With respect to the ETB 22, no input is required from the user.

The user can utilize a report provided by the program of the present invention to determine the amount of data traced for the number of clock cycles run. From this information the user can determine the size of SRAM needed for the ETB 22.

TPIU

The TPIU 20 is a trace sink. The TPIU 20 (trace port interface unit) contains a FIFO that is 128 bits. The data is put into the TPIU FIFO at the AMBA Trace bus speed (ATCLK). The data is taken out of the TPIU FIFO at the input trace clock speed, TRACECLKIN. The number of bits taken out per TRACECLKIN is determined by the trace port width.

The user will need to specify the trace port width and the TRACECLKIN speed.

The TPIU 20 can wait for the trace source (drive ATREADYS low) during trigger conditions and when the TPIU FIFO does not have enough room for the data. For rough architecture work, this program will flag when the TPIU FIFO is full, but not apply any wait state information to the trace stream. The trigger conditions should be minor for this rough estimation and are also ignored.

In summary, with respect to TPIU 20 the input needed from the user includes:
Input trace clock speed (TRACECLKIN)
Trace port width.

TPIU-Lite

The TPIU-Lite is a trace sink. The TPIU-Lite does not contain a FIFO. The TPIU-Lite takes the trace information and formats it for the trace port. The TPIU-Lite is typically used in a stand-alone CoreSight architecture and can only support one trace source.

In summary no input is required from the user regarding TPIU-Lite.

Replicator

The replicator 38 splits the ATB trace stream into two trace streams. Typically this is used to route one trace stream to the ETB 22 and the other copy to the TPIU 20. The ATB protocol is a point-to-point protocol with handshake signals of "valid" and "ready to transfer the data on the bus". The ETB 22 and TPIU 20 receive the same data, but may have different delays in their handshaking of "ready to receive the data from the replicator 38." The replicator 38 will not forward its "ready" back to the upstream device to get more data until both the ETB 22 and TPIU 20 are "ready." This means the slowest device (typically TPIU 20) will throttle the flow from the funnel 36 through to the trace sinks (TPIU 20 and ETB 22).

Typically only the ETB 22 or TPIU 20 is used at one time. In this case, this program does not need to worry about the replicator 38. If both the ETB 22 and TPIU 20 are tracing the same information at the same time, the user should specify the required TPIU settings to get the desired results since the TPIU 20 is the slower device.

In summary, with respect to the replicator 38 no input is required from the user.

Overall Architecture

The ETM 16 in the CoreSight Architecture can be implemented in stand alone mode or in a full CoreSight Architecture.

In standalone mode, there is only one trace source (ETM) though there could be more tan one processor as they are mux'ed to the ETM inputs. In this system there is no need for the funnel. Typically the TPIU is not used. For the ETM9 and ETM 11, their standalone block is called, ETM9CSSingle (includes ETM9 and a trace port interface) and ETM11CSSingle (includes ETM11 and a trace port interface). The ETMR4 does not have "CSSingle" type block, but is implemented in stand alone mode using the TPIU-Lite.

When the user specifies stand alone mode architecture the program of the present invention will assume no second FIFO and no TRACECLKIN clock. The amount of data taken out of the ETM FIFO is specified by the trace port width. The funnel activity level can still be specified if desired.

A full CoreSight architecture system can contain multiple trace sources. In this system, the trace port analyzer and TPIU 20 is typically used instead of the TPIU-Lite component.

In summary, with respect to the overall architecture, the input required from the user includes:
Type of system: Full CoreSight (meaning TPIU 20 is used) or standalone CoreSight (meaning ETM9CSSingle, ETM11CSSingle, TPIU-Lite, or only ETB 22 is used).

Flow charts representing the program of the present invention are provided in FIGS. 2-9. These flow charts utilized the customer/user input and fixed conditions discussed above.

Figure 2:
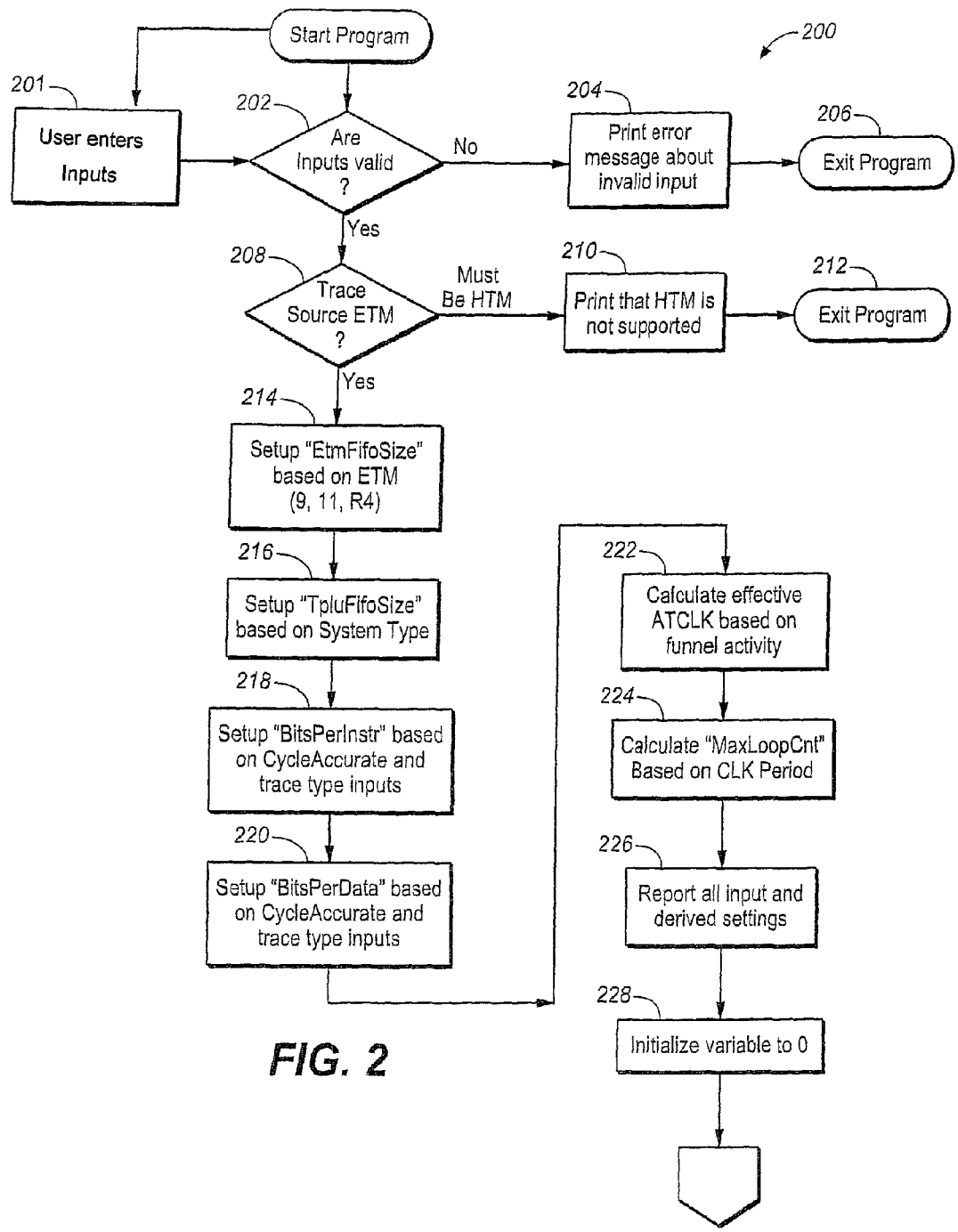
FIG. 2 is a flowchart which illustrates portion of the program of the present invention which provides for input of initial variable, derived settings and initialization of variables.
Figure 3:
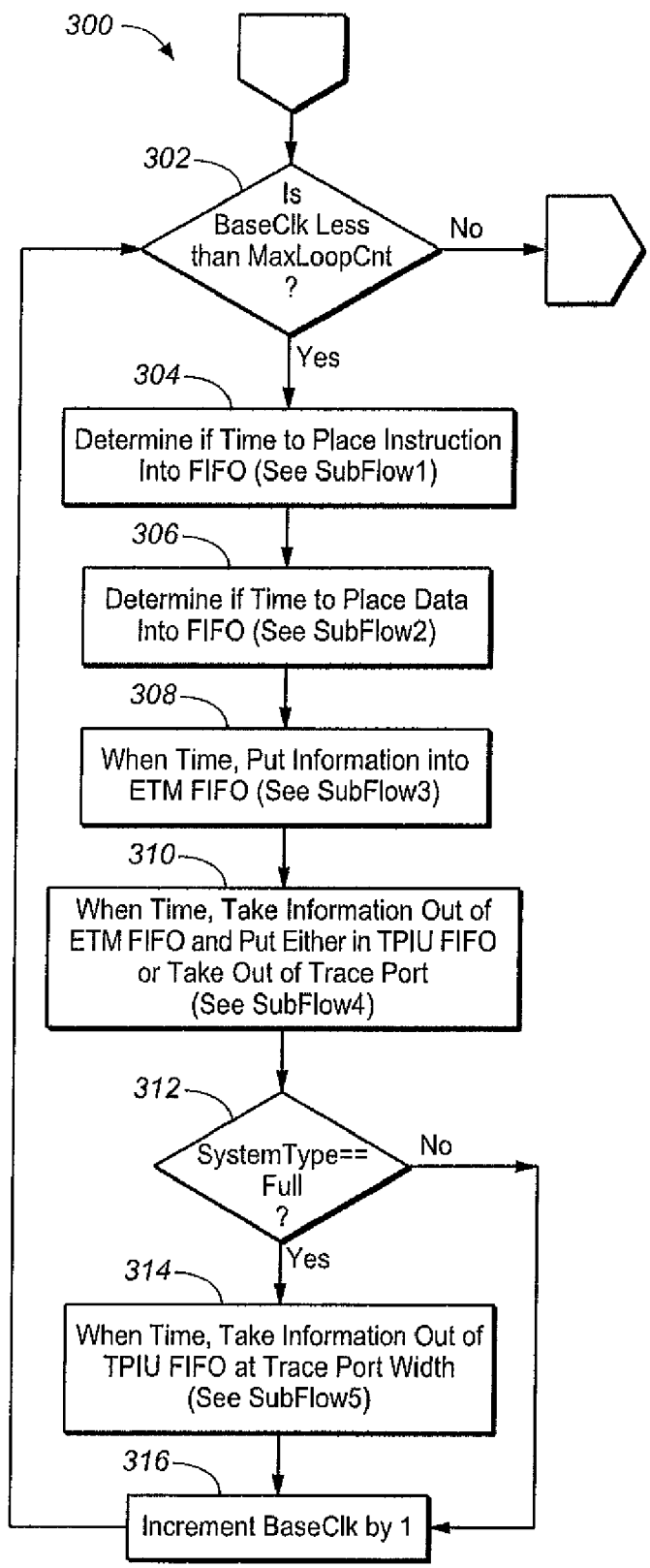
FIG. 3 is a flowchart which illustrates the main loop of the program of the present invention.
Figure 4:
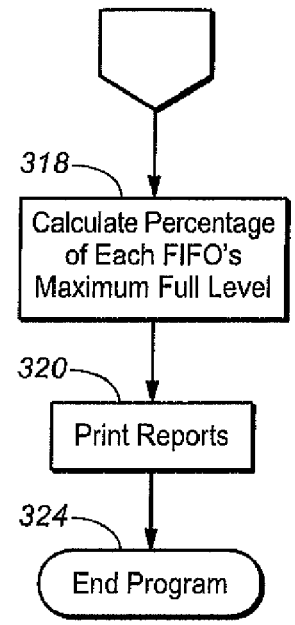
FIG. 4 is a flow chart illustrating finishing steps of the program.

Flow charts representing the main program are shown in FIGS. 2-4.

The flow chart 200 of FIG. 2 represents initial steps in the program. Initially, a user enters input variables at step 201. The process continues at step 202 wherein the program verifies that input variables are valid. If the input variables are not valid, an error message is printed at step 204 and the program is exited at step 206. If it is determined that the input variables are valid, at step 208 it is determined if the trace source is ETM. If the trace source is determined not to be ETM, at step 210 an error message is printed indicating that HTM is not supported and the program is exited at 212. If it is determined that the trace source is ETM, at step 214, the "ETM FIFO Size" is set up based upon the type of processor to be used e.g. ETM9, ETM11, or ETMR4. Next, at step 216, the "TPIU FIFO Size" is set up based upon the "System Type". At step 218, the "Bits per Instruction" is set up based upon the "Cycle Accurate" and "Trace Type" inputs. At step 220, the "Bits per Data" is set up based upon the "Cycle Accurate" and "Trace Type" inputs. At step 22, the effective ATCLK is calculated based on funnel activity. At step 224, the "Max Loop Count" is calculated based on "CLK period". At step 226, all input and derived settings are reported by printing to a standard output. At step 228, all variables are initialized to zero.

FIG. 3 represents the main loop 300 of the program. This loop represents the steps of determining when trace information (instruction and/or data) can be placed in the ETM FIFO, placing the information in the ETM FIFO, removing information from the ETM FIFO, and when appropriate placing information and taking information out of the TPIU FIFO. The BaseClk of the main loop increments by 1 ps. The CLK, ATCLK, and TRACECLKIN input periods are converted from ns to ps. The loop steps by one picosecond per iteration. The subblocks of this loop are executed based on a clock domain. For example SubLoop1 is dependent on CLK. When the BaseClk increments enough times to be an integer multiple of the CLK period, the SubLoop1 will execute. This methodology allows all the clocks to be asynchronous from each other.

At step 302 it is determined whether BaseClk is less than MaxLoopCnt. If BaseClk is less than MaxLoopCnt then at step 304 it is determined whether it is time to place instruction information into FIFO. This determination is made pursuant to SubFlow 1 which will be described below. Next at step 306 it is determined if it is time to place data information into FIFO. This determination is made pursuant to SubFlow 2 which will be described below. At step 308, when the time is appropriate, information is put into ETM FIFO. The time for putting information into ETM FIFO is determined pursuant to SubFlow 3 which will be described below. At step 310, when the time is appropriate, information is taken out of ETM FIFO and put either in TPIU FIFO or taken out of the Trace Port. The time for taking the information out of ETM FIFO is determined pursuant to Subflow 4 which will be described below. Next at step 312 it is determined whether the system type is full. If the system type is full, at step 314, when it is appropriate, information is taken out of TPIU FIFO at the Trace Port Width. The time for taking the information out of TPIU FIFO is determined pursuant to Subflow 5 which is described below. At step 316 BaseClk is incremented by 1 and the process returns to step 302. At step 302 if BaseClk is less than MaxLoopCnt, steps 304-312 are repeated. If at step 312 the System Type is determined not to be full, the process proceeds to step 316 where BaseClk is incremented by 1. Steps 302-316 continue until it is determined that the BaseClk is not less than MaxLoopCnt. When BaseClk is not less than MaxLoopCNT steps of the flow chart 300' shown in FIG. 4 are performed.

FIG. 4 represents the finishing steps of the program. When the main loop has completed, some calculations are made to show the percentage full of the FIFOs, the reports are printed to standard output and the program exits.

At step 318 the percentage of each FIFO's maximum full level is calculated. At step 320 a report is printed indicating the percentages calculated. At step 324 the program ends.

Figure 5:
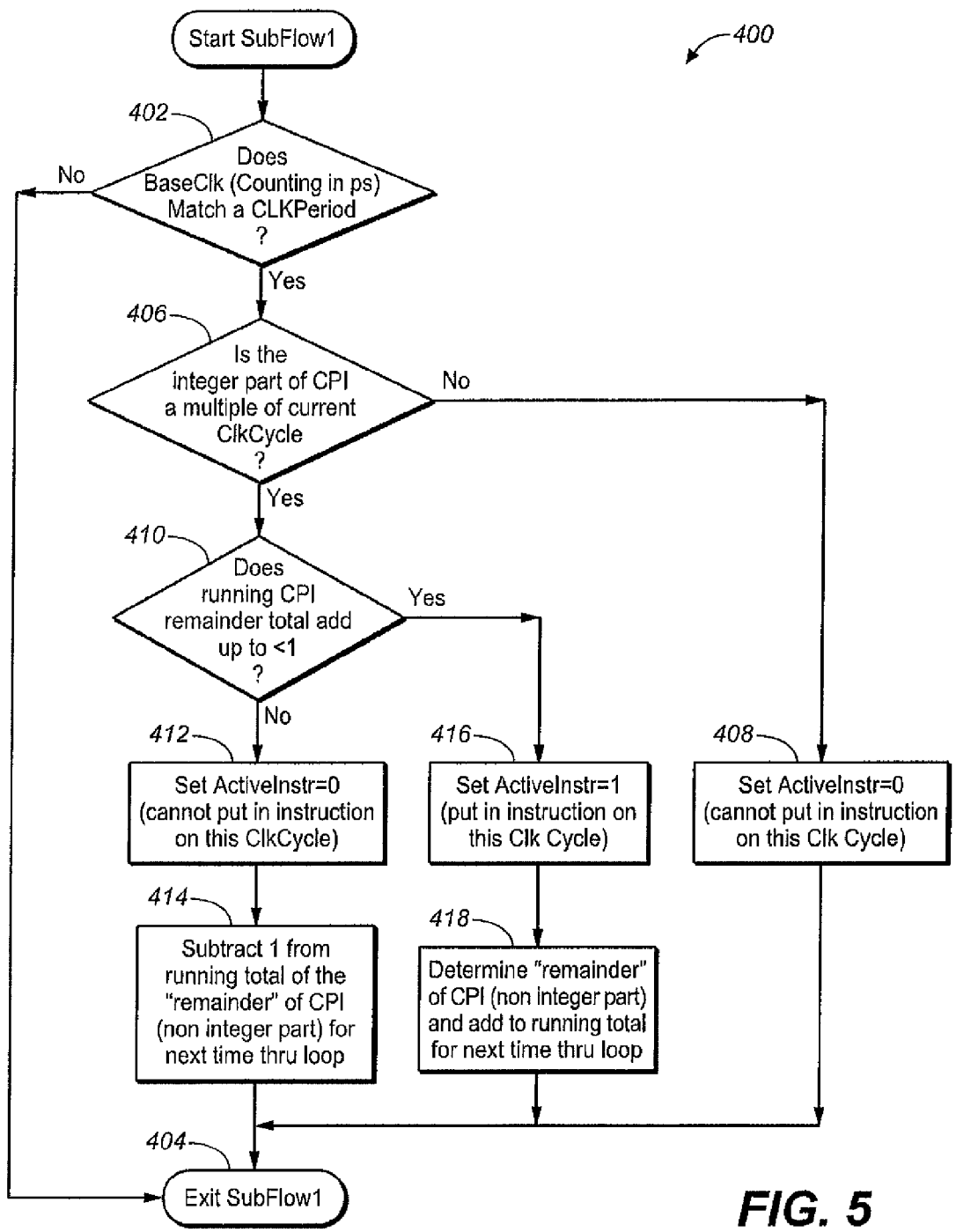
FIG. 5 is a flow chart illustrating sub-flow 1 of the program which is used to determine if it is appropriate to place instruction information in FIFO.

FIGS. 5-9 illustrate the subflows used by the main loop of the program. SubFlow1 400 shown in FIG. 5 is used to determine when an instruction, if appropriate, can be placed into the ETM FIFO. This is based on the CPI value supplied by the user. The program keeps a running total of the fractional part (the remainder) of the CPI value. When this total reaches one, an instruction will not be placed in the ETM FIFO. For example, if CPI=1.5, every third cycle should not have an instruction placed into the ETM FIFO.

More specifically SubFlow1 400 begins by determining whether BaseClk (counting in ps) matches a CLK period. If BaseClk does not match a CLK period SubFlow1 400 is exited at step 404. If BaseClk does match a CLKPeriod, at step 406 it is determined whether the integer part of CPI is a multiple of current ClkCycle. If the integer part of CPI is not a multiple of current ClkCycle, at step 408 the ActiveInstr is set to zero indicating that an instruction can not be entered in this ClkCycle and then SubFlow1 is exited at step 404. If the integer part of CPI is a multiple of current ClkCycle, the program moves to step 410 where it is determined whether the running CPI remainder total is less than 1. If the running CPI remainder total is not less than 1, at step 412 the ActiveInst is set to zero indicating that an instruction can not be entered on this ClkCycle. Then at step 414, 1 is subtracted from the running total of the remainder of CPI (non integer part) for use during the next time through the loop and SubFlow 1 is exited at step 404. If at step 410 it is determined that the running CPI remainder total is less than 1, then ActiveInstr is set to 1 indicating that instruction are entered in this ClkCycle. Next at step 418, the remainder of CPI (non integer part) is determined and added to the running total for the next time through the loop. After step 418, the program proceeds to step 404 where SubFlow1 400 is exited. For example, if CPI is 1.5, an instruction is not placed into the ETM FIFO on every third ClkCycle.

| ClkStep | | | | | | | | | | | | | | | |
|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | |
| I | I | — | I | I | — | I | I | — | I | I | — | I | I | — | |

Figure 6:
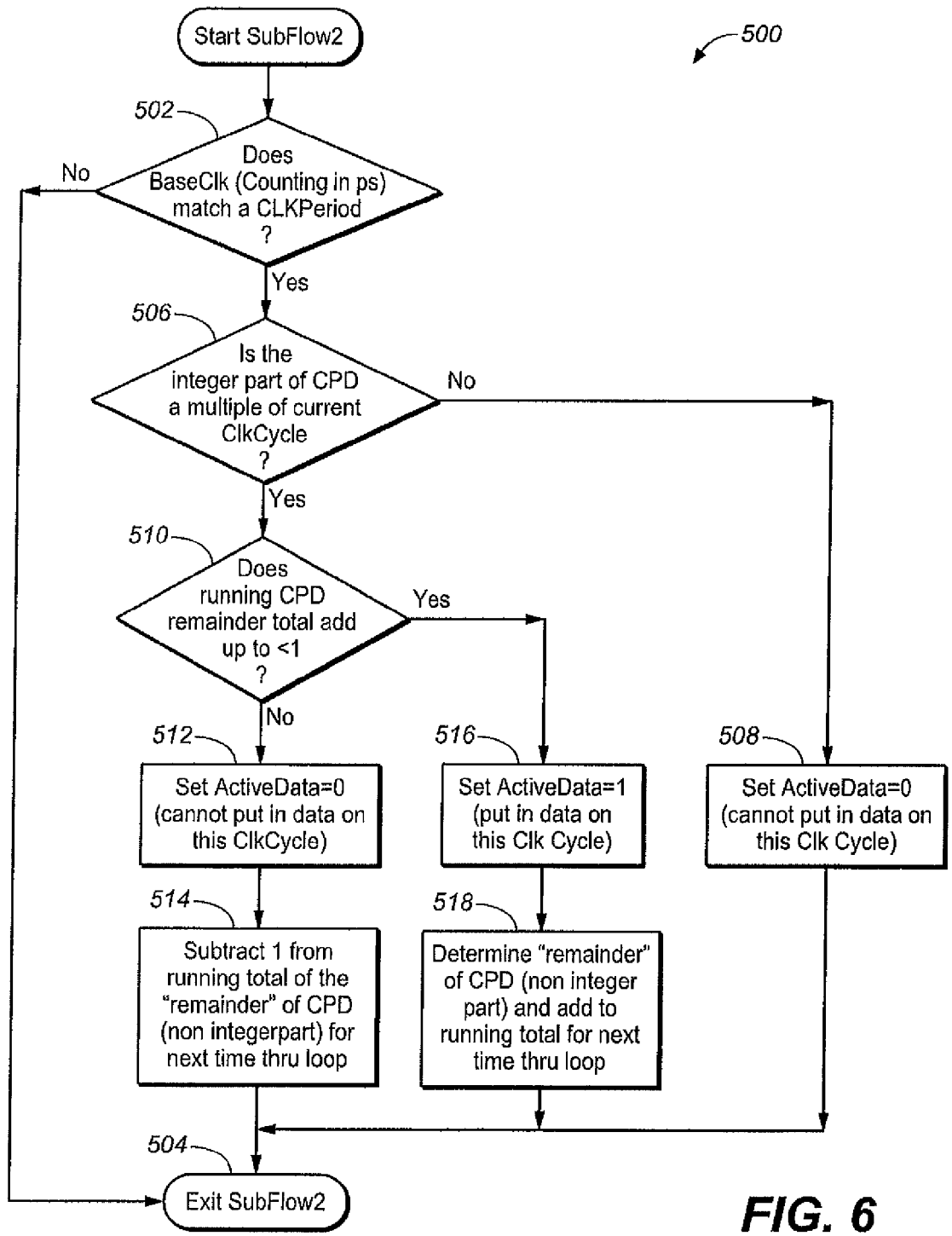
FIG. 6 is a flow chart illustrating sub-flow 2 of the program which is used to determine if it is appropriate to place data information into FIFO.

SubFlow2 500 shown in FIG. 6 is used to determine when data, if appropriate, can be placed into the ETM FIFO. This is based on the CPD value supplied by the user. This subflow uses the same concept as SubFlow1 except it tracks data (CPD) instead of instructions (CPI).

Specifically at step 502 of SubFlow2 500 it is determined whether BaseClk (counting in ps) matches a CLKPeriod. If BaseClk does not match a CLKPeriod, the program proceeds to step 504 where SubFlow2 is exited. If at step 502 it is determined that BaseClk does match a CLKPeriod, the program proceeds to step 506 where it is determined whether the integer part of CPD is a multiple of the current ClkCycle. If at step 506 it is determined that the integer part of CPD is not a multiple of current ClkCycle, the program proceeds to step 508 where the ActiveDate is set to zero indicating that data can not be entered on this ClkCycle and the program proceeds to step 504 where SubFlow2 is exited. If it is determined that the integer part of CPD is a multiple of current ClkCycle, the program proceeds to step 510 where it is determined whether the running CPD remainder total is less than 1. If at step 510 it is determined that the running CPD remainder total is not less than one, at step 512 ActiveData is set to zero indicating that data can not be entered in this ClkCycle. The program then proceeds to step 514 where 1 is subtracted from the running total of the remainder of CPD (non integer part) for the next time through the loop and the SubFlow2 is exited at step 504. If at step 510 it is determined that the running CPD remainder total is less than 1, the program proceeds to step 516 where ActiveData is set to 1 indicating that data is to be entered on this ClkCycle. The program then proceeds to step 518 where the remainder of CPD (non integer part) is determined and added to the running total for the next time through the loop. The program then proceeds to step 504 where SubFlow2 500 is exited.

Figure 7:
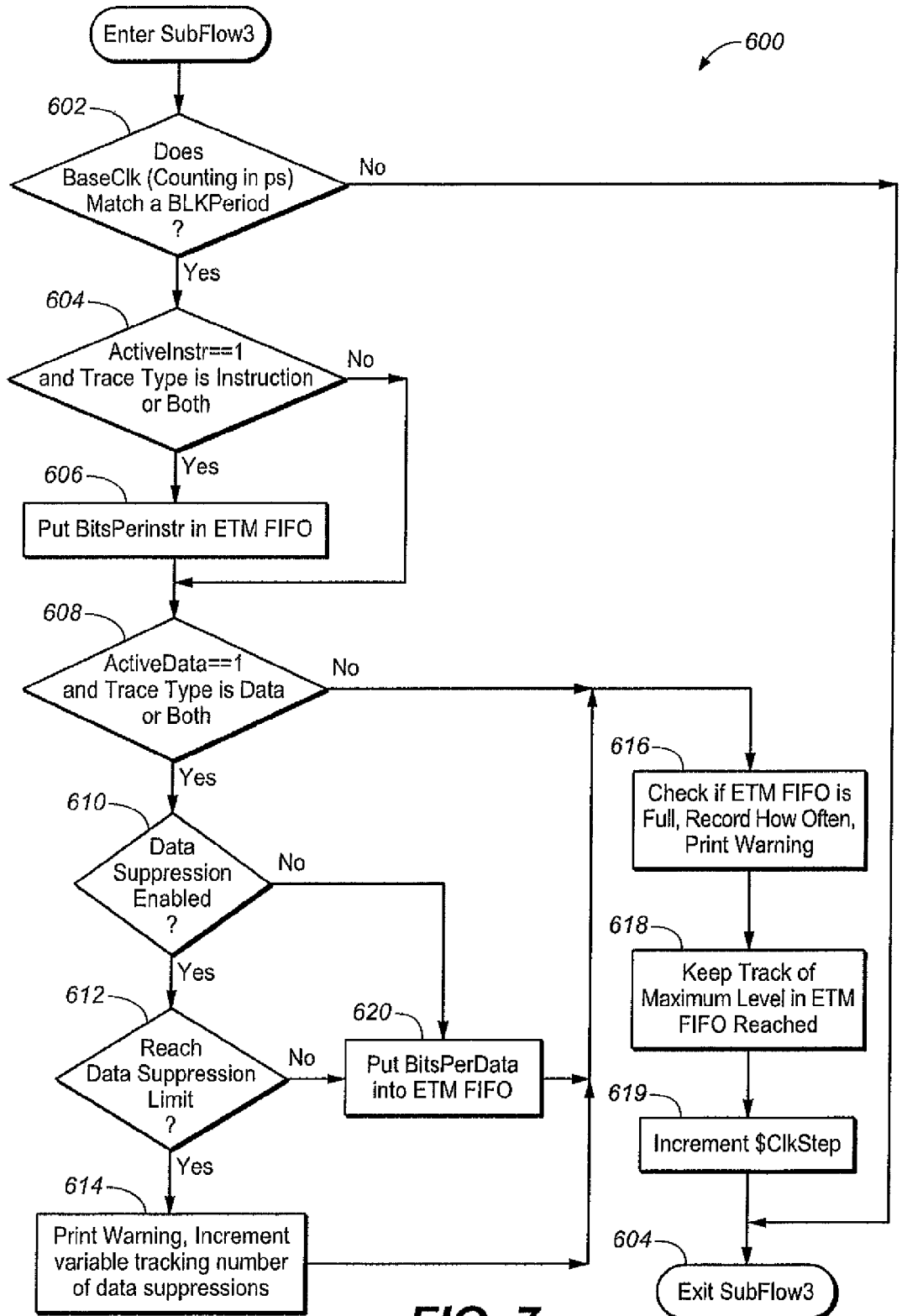
FIG. 7 is a flow chart illustrating sub-flow 3 of the program which is used to determine if it is appropriate to place information into ETM FIFO.

SubFlow3 600 shown in FIG. 7 is used to place instruction, data, or both into the ETM FIFO depending on the ActiveInstr and ActiveData variables from SubFlow1 and SubFlow2 respectively. Note the variables "BitsPerInstr" and "BitsPerData" are setup before entering the loop based on the information to trace and if Cycle Accurate information is traced. For example, if the CPI is 2 and CPD is 4, instruction is put in every other clock and data every $4^{th}$ clock.

| ClkStep | | | | | | | | | | | | | | |
|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 |
| I | — | I | — | I | — | I | — | I | — | I | — | I | — | I |
| D | — | — | — | D | — | — | — | D | — | — | — | D | — | — |

More specifically, at step 602 of SubFlow3 600, it is determined if BaseClk (counting in ps) matches a CLKPeriod. If BaseClk does not match a CLKPeriod SubFlow3 is exited at step 604. If BaseClk does match a CLKPeriod, the program proceeds to step 604. At step 604 if it is determined that ActiveInstr is set to 1 and the trace type is instruction or if ActiveInstr is set to 1 and trace type is both (instruction and data), then at step 606 BitsPerInstr is entered in ETM FIFO. The program then proceeds to step 608. If at step 604 it is determined that ActiveInstr is not set to 1, then the program proceeds directly to step 608. At step 608 it is determined if ActiveData=1 and trace type is both (instruction and data) or if ActiveData is 1 and trace type is data then the program proceeds to step 610 where it is determined if data suppression is enabled. If data suppression is not enabled, the program proceeds directly to step 620. If at step 610 it is determined that data suppression is enabled, at step 612 the program determines if the data suppression limit has been reached. If the data suppression limit has been reached, at step 614, the program provides a warning and increments the variable tracking the number of data suppressions and then proceeds to step 616. If at step 612 the data suppression limit has not been reached, the program proceeds to step 620 where the BitsPerData information is put into the ETM FIFO before proceeding to step 616. If at step 608 the ActiveData is not 1 and the Trace Type is not data or both, then at the program proceeds directly to step 616. At step 616, the program checks if the ETM FIFO is full, records how often the ETM FIFO is full, and prints a warning notifying that the ETM FIFO is full. The program then proceeds to step 618, where record is made of the maximum level reached in the ETM FIFO. At step 619, the ClkStep is incremented and the program proceeds to step 604 where SubFlow3 600 is exited.

Figure 8:
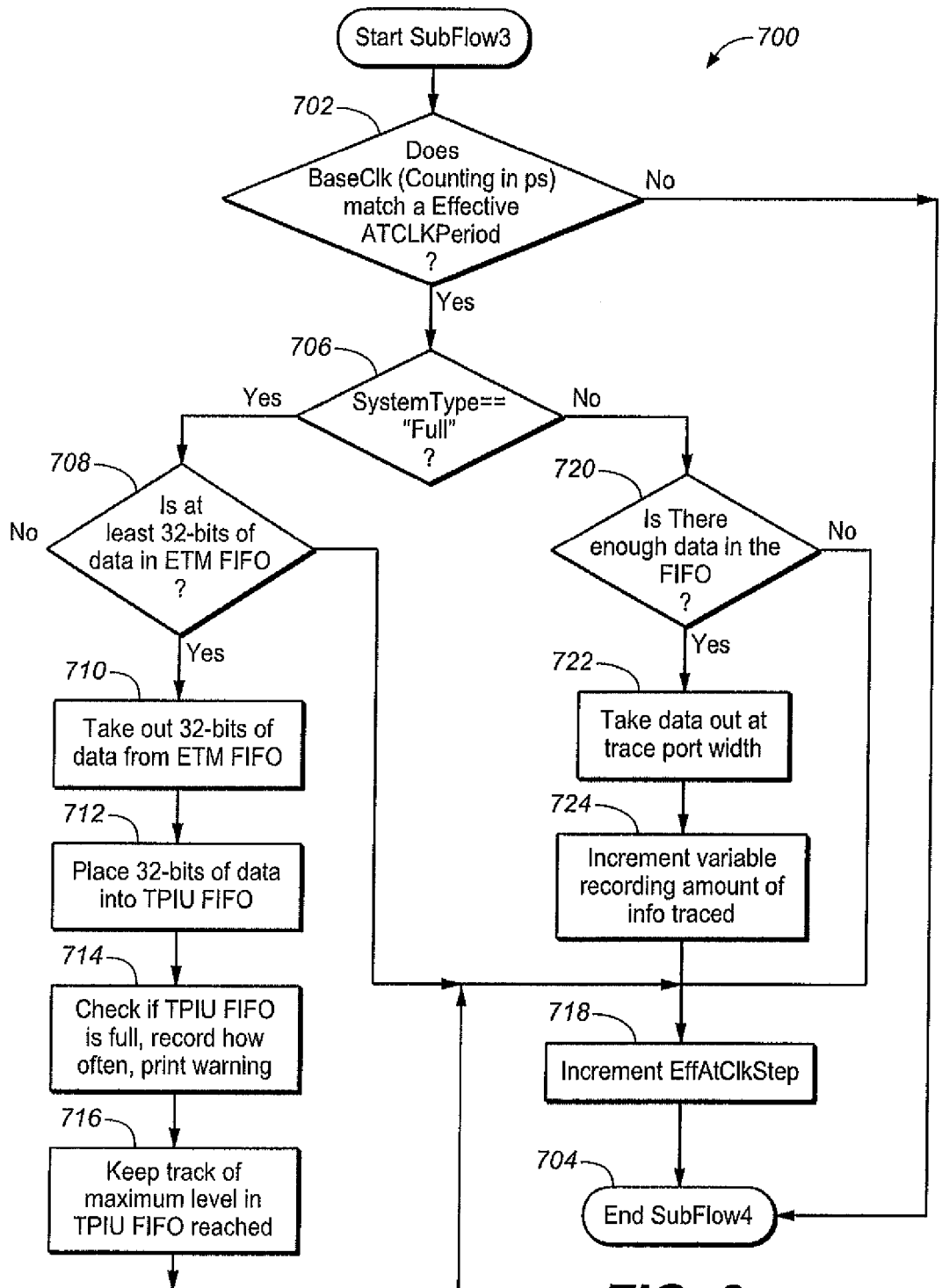
FIG. 8 is a flow chart illustrating sub-flow 4 of the program which is used to determine if it is appropriate to take information out of ETM FIFO and put information in TPIU FIFO or take information out at Trace Port Width.

SubFlow4 700 shown in FIG. 8 is used to take data out of the ETM FIFO and place it in the TPIU FIFO if appropriate (system type is full). The data is taken out at 32-bits if it is going to the TPIU FIFO or is the width of the trace port specifies how much data to take out each clock cycle if the system type is standalone.

More specifically, at step 702 of SubFlow4 700 it is determined whether the BaseClk (counting in ps) matches the Effective ATCLKPeriod. If the BaseClk does not match the Effective ATCLKPeriod the program proceeds to step 704 where SubFlow4 700 is terminated. If the BaseClk matches the Effective ATCLKPeriod, the program proceeds to step 706 where it is determined whether the System Type is Full. If the System Type is Full then at step 708 it is determined whether there are at least 32 bits of date in ETM FIFO. If there are not 32 bits of data in ETM FIFO, the program proceeds to step 718 where the EffAtClkStep is incremented and then proceeds to step 704 where SubFlow4 700 is terminated. If at step 708 it is determined that there are at least 32 bits of data in ETM FIFO, then at step 710 32 bits of data are taken from ETM FIFO. At step 712 32 bits of data are placed in TPIU FIFO. At step 714 a determination is made as to whether TPIU FIFO is full, a record is made as to how often TPIU FIFO is full and a warning is printed. The program proceeds to step 716 where a record is made as to the maximum level reached in TPIU FIFO. Then at step 718 EffAtCLkStep is incremented and the SubFlow4 is terminated at step 704. If at step 706 it is determined that the system type is not full, the program proceeds to step 720 where it is determined whether there is enough data in FIFO. If there is not enough data in FIFO, the program proceeds to step 718 where EffAtClkStep is incremented and the program then proceeds to step 704 where SubFlow4 is terminated, if at step 720 it is determined that sufficient data is in FIFO, at step 722 data is taken out at the Trace Port Width. The program then proceeds to step 724 where the variable recording the amount of information traced is incremented. The program then proceeds to step 718 where EffAtClkStep is incremented and to step 704 where SubFlow 704 is terminated.

Figure 9:
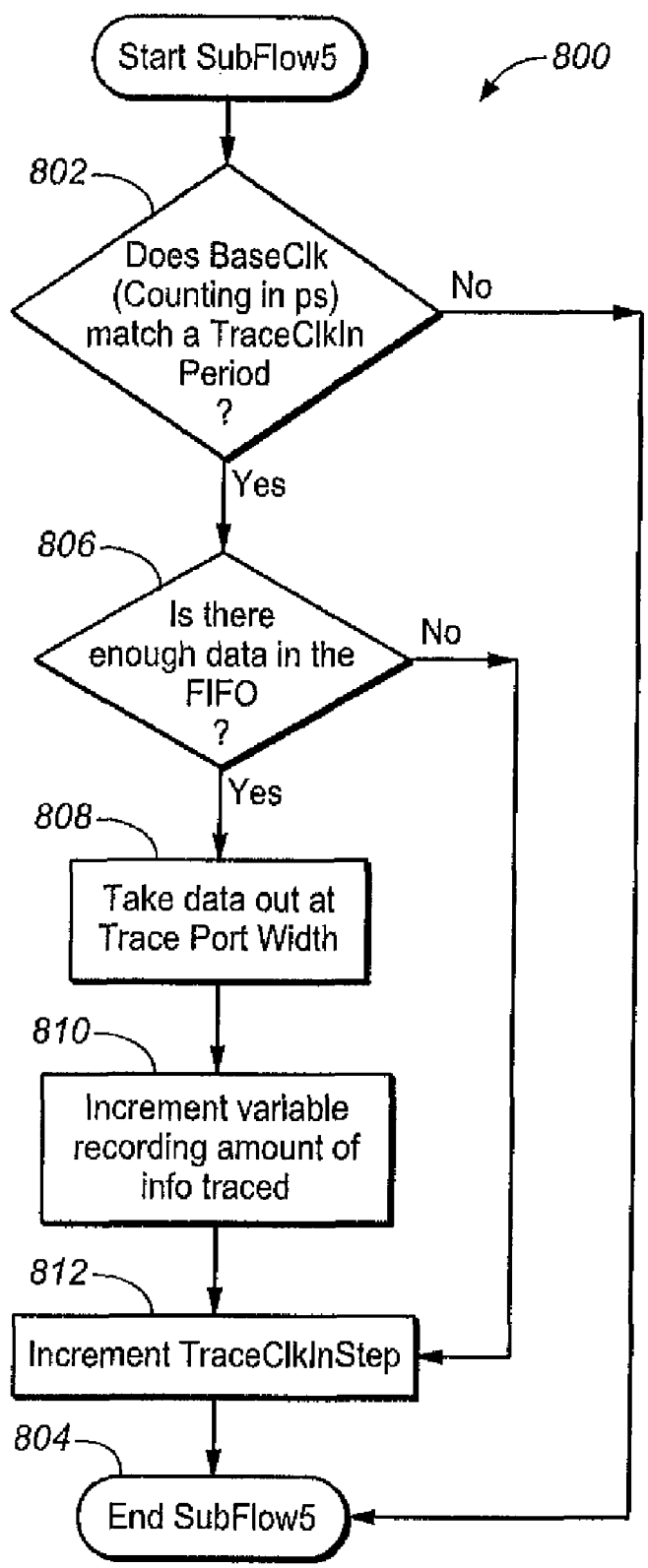
FIG. 9 is a flow chart illustrating sub-flow 5 of the program which is used to determine if it is appropriate to take information out of TPIU FIFO at Trace Port Width.

SubFlow5 800 shown in FIG. 9 is used to take data out of the TPIU FIFO when the system type is full. The amount of data taken out each clock cycle is specified by the trace port width.

More specifically at step 802 of SubFlow5 800 it is determined whether the BaseClk (counting in ps) matches the TraceClkIn Period. If the BaseClk does not match the TraceClkIn Period, SubFlow5 800 is terminated at step 804. If the BaseClk matches the TraceClkIn Period, at step 806 it is determined whether there is enough data in FIFO. If there is not enough data in FIFO, the program proceeds to step 812 where TraceClkInStep is incremented and then to step 804 where SubFlow5 800 is terminated. If at step 806 it is determined that there is sufficient data in FIFO, data is taken out at the Trace Port Width. The program proceeds to step 810 where the variable recording the amount of information traced is incremented and then to step 812 where the TraceClkInStep is incremented. Finally, at step 804, SubFlow5 800 is terminated.

When taking data out of either FIFO, the program must ensure that data cannot be put in and taken out of the same FIFO on the same BaseClk. When entering SubFlow3 the level of the ETM FIFO is saved and when entering SubFlow4 the level of the TPIU FIFO is saved. This is on the CLK and ATCLK period respectively. These saved FIFO levels are used in SubFlow4 and SubFlow5, respectively, to determine if there is enough data in that particular FIFO to be removed. This method is pessimistic because these saved levels are updated on each CLK and ATCLK period respectively. So if the clock that takes the data out of the FIFO is asynchronous to the clock that puts the data into the FIFO a "take-out" clock can happen before the next "put-in" clock, but this program will not take the data out of the FIFO until after the next "put-in" clock regardless if more information was put into the FIFO or not.

When the loop in FIG. 3 ends, there probably will be data left in the FIFOs. The program does not do a flush to empty the FIFOs, since the purpose of the program is to get a rough idea of throughput (bandwidth) of the system, not to trace a certain amount of data. The key is to make sure enough cycles through the loop have been taken to get a stable answer.

Usage of the program illustrated in FIGS. 2-9 is illustrated below.

```
Usage:
    ./TraceBandWidthEst.tcl <trace_source> <system_type>
    <clk> <atclk>
    <traceclkin> <funnel_act> <trace_data_width> <trace_type>
    <cycle_accurate> <cpi> <cpi> <data_suppression_enable>
    <data_suppression_level>
    where:
        <trace_source>:           ETM9, ETM11, ETMR4
        <system_type>:            full or standalone
        <clk>:                    Processor clock period (CLK)
                                  in ns
        <atclk>:                  AMBA Trace Bus clock
                                  period (ATCLK) in ns
        <traceclkin>:             TRACECLKIN period in ns.
                                  Set to 0 if not using TPIU
        <funnel_act>:             Percentage this ETM is
                                  enabled by the funnel
                                  This number should be
                                  between 0 and 100
        <trace_data_width>:       2, 4, 8, 16, 32. Use 32 for
                                  ETB
        <trace_type>:             instruction, data, both
        <cycle_accurate>:         yes, no
        <cpi>:                    Cycles per instruction (can be
                                  real number)
        <cpd>:                    Cycles per data (can be real
                                  number)
        <data_suppression_enable>: yes, no
        <data_suppression_level>:  Number of bytes from FIFO
                                   full to suppress data
Example:
    TraceBandWidthEst.tcl ETM9 standalone 3.0 4.0 0 100 16 both
    no 1.2 8
    yes 5
```

Examples of how to use the program of the present invention in order to evaluate typical architectures are illustrated in FIGS. 10-15.

Figure 10:
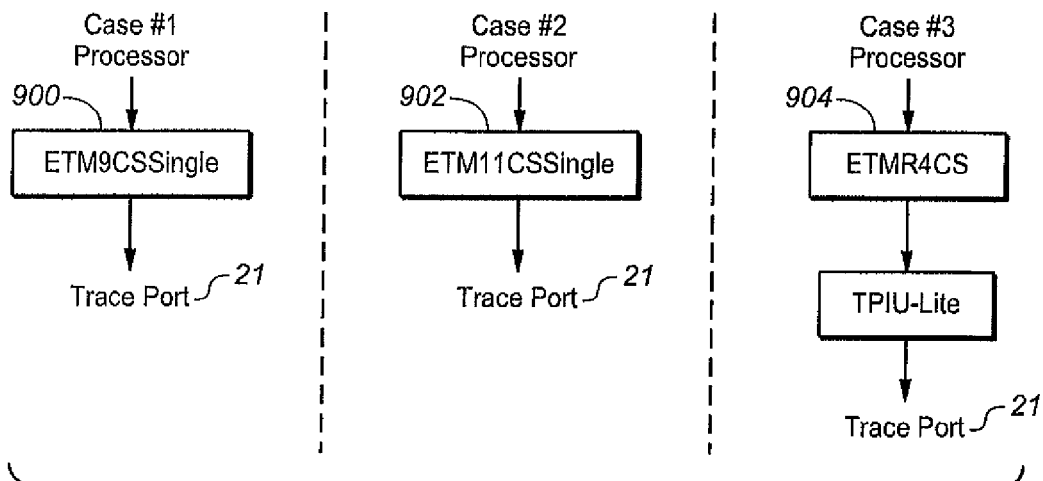
FIG. 10 illustrates trace sources in standalone CoreSight architecture using only the trace port.
Figure 11:
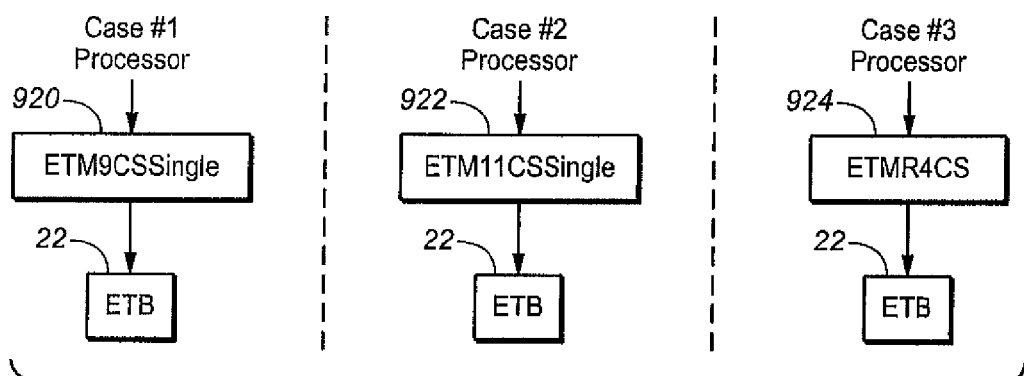
FIG. 11 illustrates trace sources in standalone CoreSight architecture using only ETB.
Figure 12:
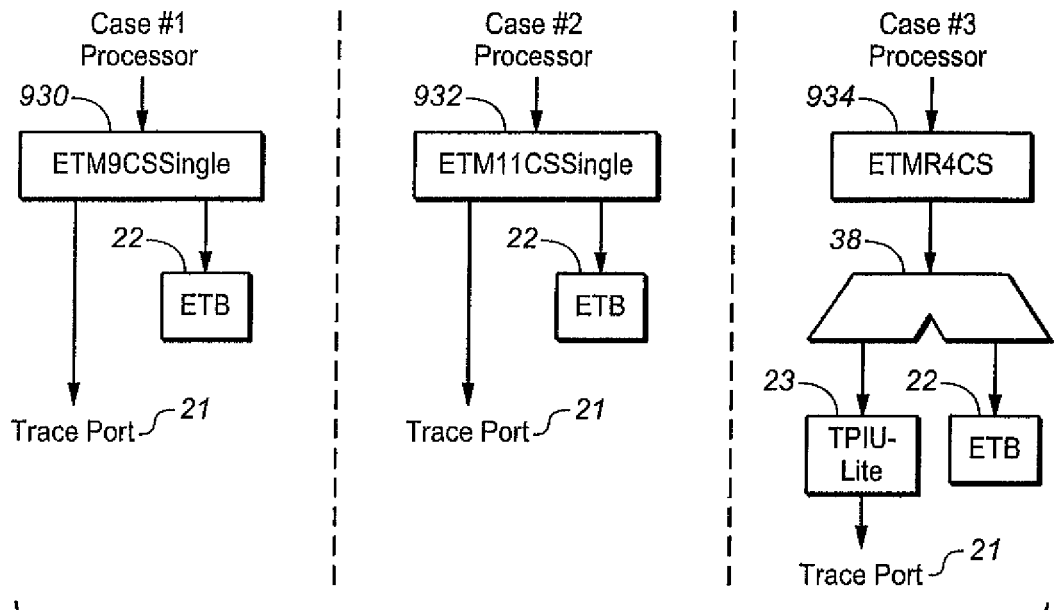
FIG. 12 illustrates trace sources in standalone CoreSight architecture using the ETM and Trace Port.

FIG. 10 illustrates ETM9, ETM11 and ETMR4 trace sources in standalone CoreSight architecture using only the trace port 21. To evaluate the architecture represented, the input variables for the program of the present invention must be set as follows:
trace_-source: ETM9, ETM11, or ETMR4
system_type: standalone
traceclkin: 0
funnel_act: 100
The following variables can be set as desired by the user:
clk
atclk
trace_data-width
trace_type
cycle_accurate
cpi
cpd
data_suppression_enable
data_suppression_level FIG. 11 illustrates ETM9, ETM11, and ETMR4 trace sources in standalone CoreSight architecture using only the ETB 22. To evaluate the architecture represented, the input variables for the program of the present invention must be set as follows:
trace_source: ETM9, ETM11, or ETMR4
system_type: standalone
traceclkin: 0
funnel_act: 100
trace_data_width: 32
The following variables can be set as desired by the user:
clk
atclk
trace_type
cycle_accurate
cpi
cpd
data_suppression_enable
data_suppression_level FIG. 12 illustrates the ETM9 930, ETM11 932 and ETMR4 934 trace sources in standalone CoreSight architecture using the ETB 22 and Trace Port 21. In this case the architecture has two trace sinks, the trace port 21 and ETB 22. The program must, therefore, be run two times, once for each trace sink. When the program is executed to evaluate the trace port, the settings for the input variables discussed with respect to FIG. 10 should be used. When the program is executed to evaluate the ETB 22, the settings for the input variables discussed with respect to FIG. 11 should be used.

It should be noted that in Case #3 934 of FIG. 12 wherein the replicator 38 is utilized, the user should note that the TPIU-Lite 23 will pace the flow of data from the trace source through the replicator 38 to the trace sinks 21, 22.

Figure 13:
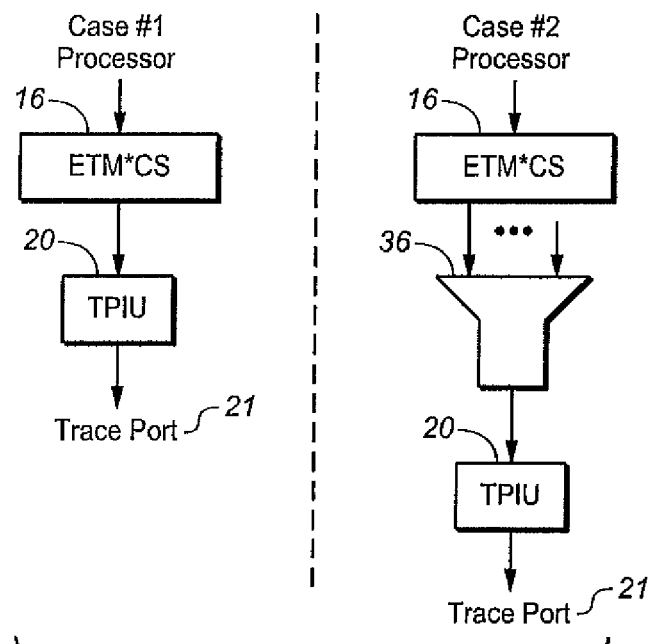
FIG. 13 illustrates trace sources in full CoreSight architecture using only the TPIU and trace port.

FIG. 13 illustrates ETM9, ETM11 or ETMR4 trace sources in a full CoreSight Architecture using only the TPIU and trace port. Only the components from the processor trace stream to the trace port 21 are illustrated in FIG. 13. Case 1 of FIG. 13 illustrates ETM 16 directly to TPIU 20, while Case 2 illustrates the use of a funnel 36 with the ETM 16 and TPIU 20. The funnel 36 could enable additional trace sources If the funnel 36 enables additional trace sources, the funnel activity should be specified. If, however, the funnel 36 always enables only the single ETM 16, then the funnel activity is specified as 100%. When the program is executed to evaluate the architecture represented in FIG. 13, the input variables for the program are set as follows:
trace_source: ETM9, ETM11 or ETMR4
system_type: full
For case #1 without a funnel: funnel_act: 100
For case #2 with a funnel: funnel_act
The following variables can be set as desired by the user:
clk
atclk
traceclkin
trace_data_Width
trace_type
cycle_accurate
cpi
cpd
data_suppression_enable
data_suppression_level For case #2 in FIG. 13 if there is more than one trace source connected to the funnel 36, the program should be run multiple times (once per trace source) using the appropriate funnel activity for each trace source.

Figure 14:
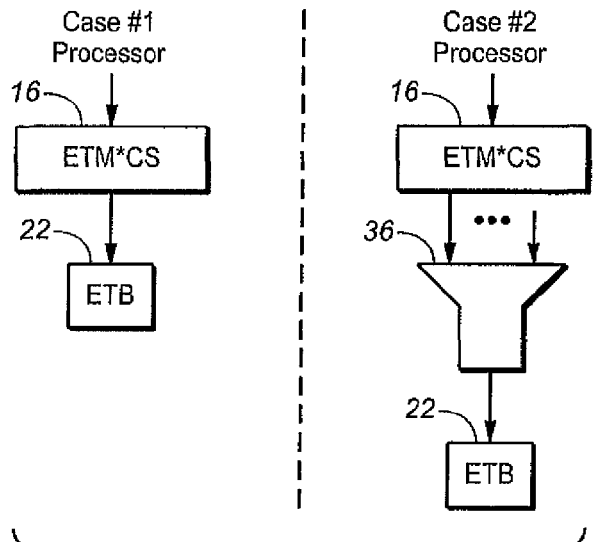
FIG. 14 illustrates trace sources in full CoreSight architecture using only the ETB.

FIG. 14 illustrates the ETM9, ETM11, or ETMR4 trace sources in a full CoreSight Architecture using only the ETB 22 and no trace port. Only the components from the processor trace stream to the ETB 22 are illustrated.

Case #1 of FIG. 14 shows the ETM 16 to ETB 22, while case #2 of FIG. 14 shows the use of a funnel 36 with the ETM 16 and ETB 22. The funnel 36 could enable additional trace sources. If the funnel 36 enables additional trace sources, the funnel 36 activity should be specified. If the funnel 36 always enables only the single ETM 16, then the funnel activity is specified as 100%. The system type should be specified as "standalone" because "full" implies there is a TPIU that adds a second FIFO to the system. When evaluating the architecture illustrated in FIG. 14, the input variables for the program of the present invention are set as:

trace_source: ETM9, ETM11, or ETMR4
system_type: standalone
traceclkin: 0
For case #1 without a funnel: funnel_act: 100
For case #2 with a funnel: funnel_act
trace_data_width: 32
The following variables can be set as you wish:
clk
atclk
trace_type
cycle_accurate
cpi
cpd
data_suppression_enable
data_suppression_level For case #2 in FIG. 14, if there is more than one trace source connected to the funnel 36, the program should be run multiple times (once per trace source) specifying the appropriate funnel activity for each trace source.

Figure 15:
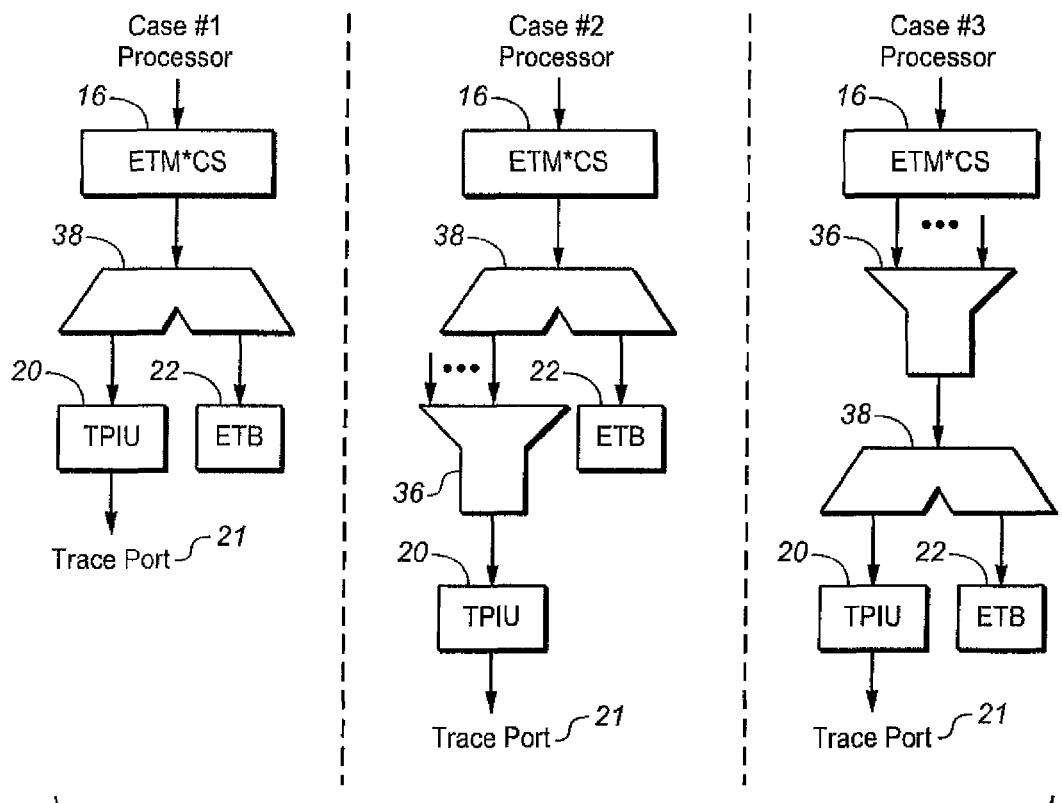
FIG. 15 illustrates trace sources in full CoreSight architecture using only the ETB and trace port.

FIG. 15 illustrates ETM 9, ETM11, or ETMR4 traces in a full CoreSight Architecture using the ETB 22 and trace port 21. Only the components from processor trace stream to the ETB and trace port are illustrated.

Case #1 of FIG. 15 shows the ETM 16 through the replicator 38 to the ETB 22 and trace port 21. Case #2 of FIG. 15 shows an alternate configuration that allows other trace sources to use the TPIU 20 through a funnel 36. Case #3 of FIG. 15 shows the use of a funnel 36 to allow other trace sources to use both the TPIU 20 and ETB 22. The funnel 36 could have other trace sources where the funnel activity should be specified. If the funnel 36 always enables only the single ETM 16, then the funnel activity is specified as 100%.

When using the replicator 38, the users must be aware that the TPIU 20 will pace the flow of data from the trace source 16 through the replicator 38 to the trace sinks 21, 22.

In the event the architecture has two trace sinks, the ETB 22 and trace port 21, the program must be executed two times, once for each trace sink. When the program is executed in connection with the ETB 22, the input variables will be designated as discussed with respect to FIG. 14. When the program is executed in connection with the trace port 21, the input variables will be designated as discussed with respect to FIG. 13. For case #2 and case #3 in FIG. 15, if there are more than one trace source connected to the funnel 36, the program should be run multiple times (once per trace source) using the appropriate funnel activity for each trace source.

Before executing the main loop, the program reports all the input settings and derived settings to allow the user to verify the inputs. As the main loop is executing the program will report any data suppression and FIFO overflows that may occur. After the main loop has completed, the program reports the following:

Number of clock cycles executed
Number of ETM FIFO fulls and data suppressions
The high watermark of the ETM FIFO
If applicable, the number of TPIU FIFO fulls
If applicable, the high watermark of the ETM FIFO
The amount of data traced This information can be used to determine if the proposed architecture including clock speed and trace port width will accommodate the desired trace information. The ETB SRAM can be sized by examining the amount of data traced over the number of clock cycles.

The following is an example of the information provided by the program of the present invention when executed.

```
$> ./TraceBandWidthEst.tcl ETM9 standalone 3.0 3.0 0 100 8 both
no 1.5 6 yes 5
    Input settings:
        TraceSource           = ETM9
        SystemType            = standalone
        InClkPeriod           = 3.0
        InAtClkPeriod         = 3.0
        InTraceClkInPeriod    = 0
        FunnelActivity        = 100
        TraceDataWidth        = 8
        TraceType             = both
        CycleAccurate         = no
        CPI                   = 1.5
        CPD                   = 6
        DataSuppEn            = yes
        DataSuppLevel         = 5
Derived Settings:
        EtmFifoSize           = 480
        TpiuFifoSize          = 0
        BitsPerInstr          = 4
        BitsPerData           = 40
        ClkPeriod (ps)        = 3000
        EffAtClkPeriod (ps)   = 3000
        TraceClkInPeriod (ps) = 0
        MaxLoopCnt (ps)       = 3000000
        WARNING: Data Suppressed (ETM FIFO) @ 324 CLK cycle
        WARNING: Data Suppressed (ETM FIFO) @ 354 CLK cycle
        WARNING: Data Suppressed (ETM FIFO) @ 384 CLK cycle
        WARNING: Data Suppressed (ETM FIFO) @ 414 CLK cycle
        WARNING: Data Suppressed (ETM FIFO) @ 444 CLK cycle
        WARNING: Data Suppressed (ETM FIFO) @ 474 CLK cycle
        WARNING: Data Suppressed (ETM FIFO) @ 504 CLK cycle
        WARNING: Data Suppressed (ETM FIFO) @ 534 CLK cycle
        WARNING: Data Suppressed (ETM FIFO) @ 564 CLK cycle
        WARNING: Data Suppressed (ETM FIFO) @ 594 CLK cycle
        WARNING: Data Suppressed (ETM FIFO) @ 624 CLK cycle
        WARNING: Data Suppressed (ETM FIFO) @ 654 CLK cycle
        WARNING: Data Suppressed (ETM FIFO) @ 684 CLK cycle
        WARNING: Data Suppressed (ETM FIFO) @ 714 CLK cycle
        WARNING: Data Suppressed (ETM FIFO) @ 744 CLK cycle
        WARNING: Data Suppressed (ETM FIFO) @ 774 CLK cycle
        WARNING: Data Suppressed (ETM FIFO) @ 804 CLK cycle
        WARNING: Data Suppressed (ETM FIFO) @ 834 CLK cycle
        WARNING: Data Suppressed (ETM FIFO) @ 864 CLK cycle
        WARNING: Data Suppressed (ETM FIFO) @ 894 CLK cycle
        WARNING: Data Suppressed (ETM FIFO) @ 924 CLK cycle
        WARNING: Data Suppressed (ETM FIFO) @ 954 CLK cycle
        WARNING: Data Suppressed (ETM FIFO) @ 984 CLK cycle
    Results:
        Number of CLK cycles run: 1000
        Number of ATCLK cycles run:   1000
        Number of ETM FIFO fulls (on CLK cycle) = 0
        Number of ETM FIFO Data Suppressions
        (on CLK cycle) = 23
        High watermark of ETM FIFO is 476 bits or 99.17% of
        EtmFifo
        Amount of data traced 7992 (bits)
        Amount of data traced 999.0 (bytes)
```

Thus, the present invention provides a method to vary design parameters to determine if a particular trace architecture is feasible to implement. The present invention allows the user to specify the following variables: input clock periods (CLK, ATCLK, TRACECLKIN); whether input clock periods are synchronous or asynchronous to each other; the type of trace information (instruction and/or data, cycle accurate or non cycle accurate); the trace port width; whether data suppression is to be enabled/disabled and the threshold limit at which data suppression is to occur; and whether standalone of full trace architecture is to be utilized.

Execution of the program provides report of the following information: maximum watermark of FIFOs; FIFO full and overflows; data suppression events; and information about data transferred to be compared to desired ETB SRAM size in architecture.

This invention allows a user to make quick estimates of the feasibility of a CoreSight trace architecture in an SoC before the hardware and/or firmware is available to assist in determining the initial architecture requirements for a design (CoreSight hardware, clock speeds, SRAM requirements, IO pin requirements for trace port). As a result, better die size estimates (IO count and gate count) and package requirements for the design can be provided in the early stages of planning.

It is to be understood that any programming language can be used to implement this invention. In addition, this invention can be implemented with or without a GUI. This invention can be modified to create more detailed reports. For example, the invention can provide for the user's input of the ETB SRAM size. A report could provide an indication of how full that SRAM becomes rather than simply reporting the amount of data transferred.

As ARM Ltd., implements more features of the CoreSight Architecture, for example, more trace sources and trace sinks, the invention can be expanded to cover additional features. This invention can also be expanded to include support for the HTM, ITM, PTM, and other trace sources when the trace bandwidth information, such as that provided in Table 1, is available. The current invention supports analyzing a single trace source at a time, requiring the program to be run multiple times if multiple trace sources are present in the system. This has been deemed adequate for rough estimates, however, the program can be expanded to support analysis of multiple trace sources at the same time.

While preferred embodiments of the present invention are shown and described, it is envisioned that those skilled in the art may devise various modifications of the present invention without departing from the spirit and scope of the appended claims.

What is claimed is:

1. A method of having a computer program embodied on a computer readable medium evaluate the feasibility for proposed SoC architecture comprising the steps of:
    having a user enter input variables relating to a proposed SoC architecture for generating and capturing trace information;
    assigning values to the input variables;
    generating trace information;
    determining whether it is an appropriate time to place said trace information into a trace source FIFO;
    if the time is appropriate, placing said trace information into said trace source FIFO;
    determining whether it is an appropriate time to remove said trace information from said trace source FIFO;
    if the time is appropriate, removing said trace information from said trace source FIFO;
    capturing the level of data present in said trace source FIFO at various clock cycles;
    analyzing the level of data present in said trace source FIFO at various clock cycles to determine the percentage of said trace source FIFO's maximum level occupied by said trace information; and
    analyzing the percentages calculated to determine if the proposed architecture will accommodate said trace information.

2. The method of claim 1, wherein said step of assigning values includes assigning a trace source FIFO size.

3. The method of claim 1, wherein said step of assigning values includes assigning a trace sink FIFO size.

4. The method of claim 1, wherein said step of assigning values includes assigning a Bits Per Instruction value.

5. The method of claim 1, wherein said step of assigning values includes assigning a Bits Per Data value.

6. The method of claim 1, wherein said step of assigning values further includes the step of defining the trace port width.

7. The method of claim 1, wherein said step of removing said trace information from said trace source FIFO further includes providing said trace information at a trace port.

8. The method of claim 1, wherein said step of assigning values further includes assigning the clock rate at which trace information is placed in and taken out of the trace source FIFO.

9. The method of claim 1, wherein said step of assigning values includes assigning a threshold limit for data suppression.

10. The method of claim 3, wherein said step of removing said trace information from said trace source FIFO further includes placing said trace information in a trace sink FIFO.

11. The method of claim 10, further including the step of removing said trace information from said trace sink FIFO and providing said trace information at a trace port.

12. The method of claim 10, wherein said step of assigning values includes assigning the clock rate at which trace information is placed in and taken out of the trace sink FIFO.

13. The method of claim 10, further comprising the steps of:
    capturing the level of data present in said trace sink FIFO at various clock cycles;
    analyzing the level of data present in said trace sink FIFO at various clock cycles to determine the percentage of said trace sink FIFO's maximum level occupied by the information; and
    analyzing the percentages calculated to determine if the proposed architecture will accommodate said trace sink information.

14. A method of evaluating a proposed trace architecture in a SoC comprising the steps of:
    proposing a trace architecture;
    providing a computer program embodied on a computer readable medium to accept input variables from a user relating to said trace architecture;
    having a user enter said input variables into said computer program;
    executing said computer program to generate results about the proposed trace architecture; and, without requiring hardware or firmware,
    evaluating the results generated to determine if the proposed trace architecture is feasible, wherein said results include trace source FIFO information.

15. The method of claim 14, wherein said input variables include the amount of trace information to be put into the trace source FIFO and the frequency at which the trace information is to be put into the trace source FIFO.

16. The method of claim 15, wherein an estimated amount of trace information to be put into the trace source FIFO is provided through published documentation regarding the trace source.

17. The method of claim 15, wherein an estimated amount of data to be put into the trace source FIFO is provided by running example software to provide the number of bits for each type of trace information.

18. The method of claim 14, wherein said trace source FIFO information includes the number of instances wherein the trace source FIFO was full or overflows.

19. The method of claim 14, wherein said trace source FIFO information includes the number of instances wherein data was suppressed by the trace source FIFO.

20. The method of claim 14, wherein said trace source FIFO information includes the maximum level of data which occurred in the trace source FIFO.

21. The method of claim 14, wherein said trace source FIFO information includes the amount of data traced in a predetermined number of clock cycles.

22. The method of claim 14, wherein said results include trace sink FIFO information.

23. The method of claim 22, wherein said trace sink FIFO information includes the number of instances wherein the trace sink FIFO was full or overflows.

24. The method of claim 22, wherein said trace sink FIFO information includes the maximum level of data which occurred in the trace sink FIFO.

25. The method of claim 22, wherein said trace sink FIFO information includes the amount of data traced in a predetermined number of clock cycles.

26. The method of claim 14, wherein said input variables include the clock rate at which the trace information is placed in and taken out of the trace source FIFO.

27. The method of claim 14, wherein said input variables include the clock rate at which the trace information is placed in and taken out of the trace sink FIFO.

28. The method of claim 14, wherein said input variables include the type of trace information to be collected.

29. The method of claim 14, wherein said input variables include a threshold limit for data suppression.

30. The method of claim 14, wherein said input variables include an indication of the trace architecture as full or standalone.

31. The method of claim 14, wherein said input variables include the trace source FIFO size and the trace sink FIFO size.

32. The method of claim 14, wherein said input variables include the width of the trace port.

* * * * *